United States Patent
Lee

(10) Patent No.: US 7,407,828 B2
(45) Date of Patent: Aug. 5, 2008

(54) CMOS IMAGE SENSOR AND MANUFACTURING METHOD THEREOF

(75) Inventor: Sang-Gi Lee, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 238 days.

(21) Appl. No.: 11/293,082

(22) Filed: Dec. 5, 2005

(65) Prior Publication Data

US 2006/0124986 A1    Jun. 15, 2006

(30) Foreign Application Priority Data

Dec. 15, 2004    (KR)    .................. 10-2004-0106130

(51) Int. Cl.
*H01L 21/00*    (2006.01)

(52) U.S. Cl. .................. 438/57; 438/199; 438/584; 438/663; 257/E27.046

(58) Field of Classification Search .................. 438/57
See application file for complete search history.

(56) References Cited

U.S. PATENT DOCUMENTS

2002/0000623 A1*  1/2002  Cho et al. .................. 257/388
2006/0038241 A1*  2/2006  Matsuo .................. 257/401

FOREIGN PATENT DOCUMENTS

KR   10-2002-0025839    4/2002
KR   10-2003-0053158    6/2003

* cited by examiner

*Primary Examiner*—Walter Lindsay, Jr.
*Assistant Examiner*—Abdulfattah Mustapha
(74) *Attorney, Agent, or Firm*—McKenna Long & Aldridge LLP

(57) ABSTRACT

A gate insulation layer with a high dielectric constant for a CMOS image sensor formed by a damascene process. A silicide layer on a gate electrode layer is formed in both a pixel region and a peripheral circuit region, and a silicide layer on a source/drain region is formed only in a peripheral circuit.

4 Claims, 4 Drawing Sheets

Pixel region | Peripheral circuit region

Pixel region | Peripheral circuit region

CMOS IMAGE SENSOR AND MANUFACTURING METHOD THEREOF

CROSS-REFERENCE TO RELATED APPLICATION

This application claims priority to and the benefit of Korean Patent Application No. 10-2004-0106130 filed in the Korean Intellectual Property Office on Dec. 15, 2004, the entire contents of which are incorporated herein by reference.

BACKGROUND OF THE INVENTION

1. Field of the Invention

The present invention relates to a complementary metal oxide semiconductor (CMOS) image sensor and a manufacturing method thereof. More particularly, the present invention relates to a CMOS image sensor, with an insulation layer of a high dielectric constant, having a non-silicided source/drain region in a pixel region and a silicided source/drain region in a peripheral circuit region, and a manufacturing method thereof.

2. Description of the Related Art

In a CMOS image sensor having a pixel region and a peripheral circuit region, a silicide layer is usually formed on a source/drain region of a MOS transistor only in the peripheral circuit region but not in the pixel region. This is because a dark current, one of the undesirable characteristics of a CMOS image sensor, can be decreased by forming a non-silicided source/drain region in the pixel region, and high performance of input/output logic in a CMOS image sensor can be achieved by forming a silicided source/drain region in the peripheral circuit region.

FIG. 1 is a cross-sectional view showing a manufacturing method of a conventional CMOS image sensor.

Referring to FIG. 1, a trench isolation layer 102 defining an active region is formed on a semiconductor substrate 100 having a pixel region and a peripheral circuit region. After forming well regions (not shown) in the pixel region and the peripheral circuit region, a gate insulation layer 104 and a gate electrode layer 106 are formed on the semiconductor substrate 100. Subsequently, an extended source/drain region 108 is formed by an ion implantation process. A gate spacer layer 110 is then formed on the sidewall of the gate insulating layer 104 and the gate electrode layer 106. A deep source/drain region 112 is then formed by another ion implantation process.

After coating an organic material layer (not shown) on the entire surface of the semiconductor substrate 100, an upper surface of the gate electrode layer 106 is exposed by an etch-back process. A mask layer pattern (not shown) is formed to cover the pixel region and to expose the peripheral circuit region by removing the organic material layer in the peripheral circuit region. Subsequently, the mask layer pattern is removed. Using a conventional typical silicidation process, a silicide layer 114 is then formed on the gate electrode layer 106 in the pixel region, and on the gate electrode layer 106 and the source/drain region 112 in the peripheral circuit region. Accordingly, a silicide layer 114 on the gate electrode layer 106 is formed in both the pixel region and the peripheral circuit region, but a silicide layer 114 on the source/drain region 112 is formed only in the peripheral circuit region.

In the conventional manufacturing method of a CMOS image sensor, however, it is difficult to use an insulating layer with a high dielectric constant as the gate insulation layer. Furthermore, an insulating layer with a high dielectric constant is thermally unstable. Therefore, even if an insulating layer with a high dielectric constant is formed as a gate insulation layer, the insulating layer with a high dielectric constant is deteriorated by a high temperature process for subsequently forming a source/drain region.

The above information disclosed in this Background section is only for enhancement of understanding of the background of the invention and therefore it may contain information that does not form the prior art that is already known in this country to a person of ordinary skill in the art.

SUMMARY OF THE INVENTION

Accordingly, the present invention is directed to a CMOS image sensor and a manufacturing method thereof that substantially obviates one or more problems due to limitations and disadvantages of the related art. One advantage of the present invention is that it forms an insulating layer of a high dielectric constant without deterioration of the insulation layer due to high temperature processing.

An exemplary manufacturing method of a CMOS image sensor according to an embodiment of the present invention includes forming a dummy gate stack with a gate insulation layer and a dummy gate electrode layer on a semiconductor substrate; forming a gate spacer layer on at least a sidewall of the dummy gate stack, forming a source/drain region in a predetermined region on the semiconductor substrate by an ion implantation process using the dummy gate stack and the gate spacer layer as an implantation mask; removing the dummy gate stack so as to expose a partial surface of the semiconductor substrate; forming an insulation layer with a high dielectric constant on the exposed surface of the semiconductor substrate; forming a gate electrode layer on the insulation layer with a high dielectric constant; sequentially forming a liner layer and a dummy pre-metal dielectric layer on an entire surface of the semiconductor substrate having the gate electrode layer thereon; partially removing the dummy pre-metal dielectric layer and the liner layer so as to expose a surface of the gate electrode by a planarization process; sequentially removing the dummy pre-metal dielectric layer and the liner layer in a peripheral circuit region by using a mask layer pattern covering a pixel region; forming a silicide layer on the gate electrode layer in the pixel region, on the gate electrode layer in the peripheral circuit region, and on the source/drain region in the peripheral circuit region by a silicidation process; and removing the dummy pre-metal dielectric layer and the liner layer remaining in the pixel region.

After forming the dummy gate stack, the exemplary method may further include implanting impurity ions for forming an extended source/drain region of an lightly doped drain (LDD) structure by using the gate stack.

After forming the source/drain by an ion implantation process using the dummy gate stack and the gate spacer layer as an implantation mask, the exemplary method may further include diffusing the implanted impurity ions by using a rapid thermal process.

The forming process of an insulation layer with a high dielectric constant may be performed at a low temperature of under 600° C.

The liner layer may be formed as a nitride layer.

An exemplary CMOS image sensor according to an embodiment of the present invention includes a gate insulation layer with a high dielectric constant formed between gate spacers and on a semiconductor substrate after removing a dummy gate stack formed between the gate spacers, a gate electrode formed between the gate spacers and on the gate insulation layer with a high dielectric constant, a silicide layer formed on the gate electrode, and a source/drain region formed in the semiconductor substrate at a position exterior to the gate.

The gate insulation layer with a high dielectric constant may be formed between the gate spacers after the source/drain region is formed.

The removal of the dummy gate stack may be performed after the source/drain region is formed.

Such an exemplary CMOS image sensor may further include a silicide layer formed on the source/drain region in a peripheral circuit region excluding a pixel region.

The gate insulation layer with a high dielectric constant may be formed at a low temperature of under 600° C.

Additional examples of features and advantages of the invention will be set forth in the description which follows, and in part will be apparent from the description or by practice of the invention. It is to be understood that both the foregoing general description and the following detailed description are exemplary and exemplary and are intended to provide further explanation of the invention as claimed.

BRIEF DESCRIPTION OF THE DRAWINGS

The accompanying drawings, which are included to provide a further understanding of the invention, illustrate embodiments of the invention and together with the description serve to explain the principles of the invention.

DETAILED DESCRIPTION OF THE EMBODIMENTS

An exemplary embodiment of the present invention will hereinafter be described in detail with reference to the accompanying drawings.

FIG. 2 to FIG. 8 are cross-sectional views showing sequential stages of a method for manufacturing a CMOS image sensor according to an exemplary embodiment of the present invention.

Figure 1:
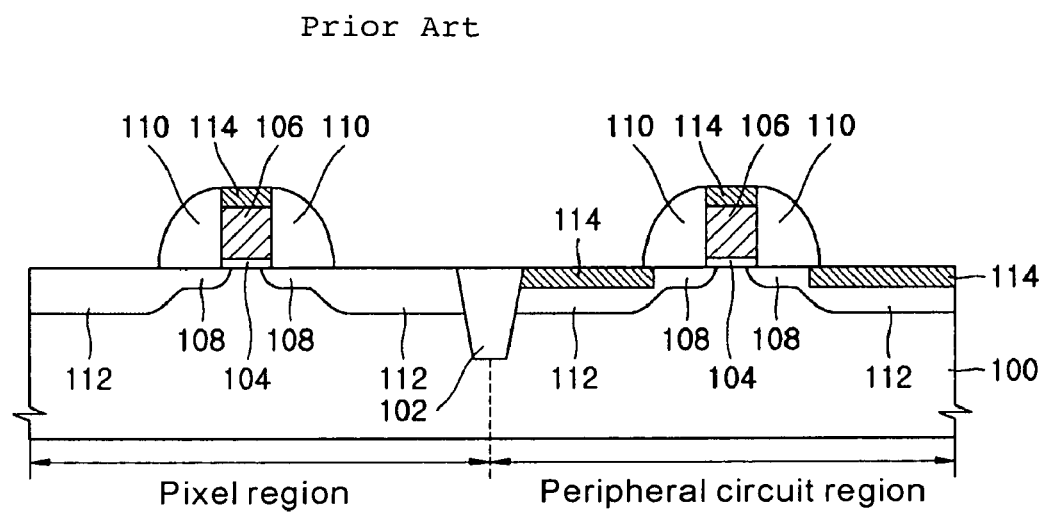
FIG. 1 is a cross-sectional view showing a manufacturing method of a conventional CMOS image sensor.
Figure 2:
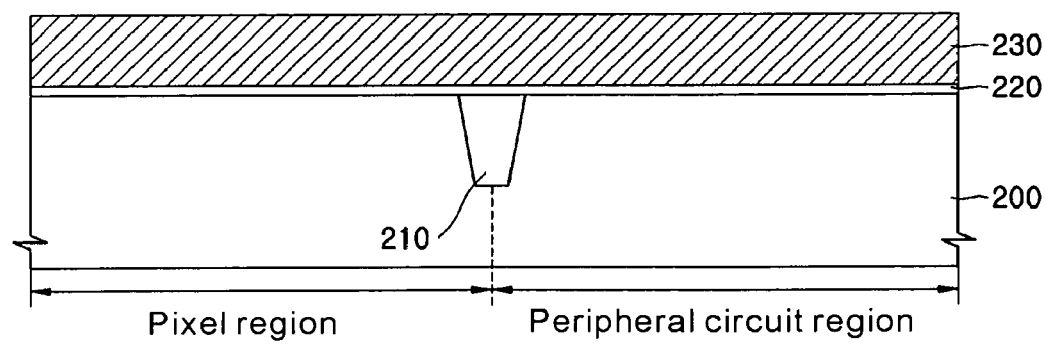
FIG. 2 to FIG. 8 are cross-sectional views showing sequential stages of a method for manufacturing a CMOS image sensor according to an exemplary embodiment of the present invention.

First, referring to FIG. 2, an active region is defined on a semiconductor substrate 200, such as a silicon substrate, by forming an isolation layer 210. The isolation layer 210 is shown to be formed as a trench type in FIG. 2, however it may be formed as various other types, for example, as a LOCOS (local oxidation of silicon) type. The isolation layer 210 not only distinguishes a pixel region from a peripheral region as shown, but may also define an active region in a pixel region or in a peripheral region. After forming the isolation layer 210, typical well regions (not shown) are formed. The well regions may be formed by an ion implantation process using an implantation mask. A gate oxide layer 220 is then formed on the semiconductor substrate 200, the isolation layer 210, and the well regions. The gate oxide layer 220 may be formed by a typical oxidation process. A dummy gate electrode layer 230 such as a polysilicon layer is then formed on the gate oxide layer 220.

Figure 3:
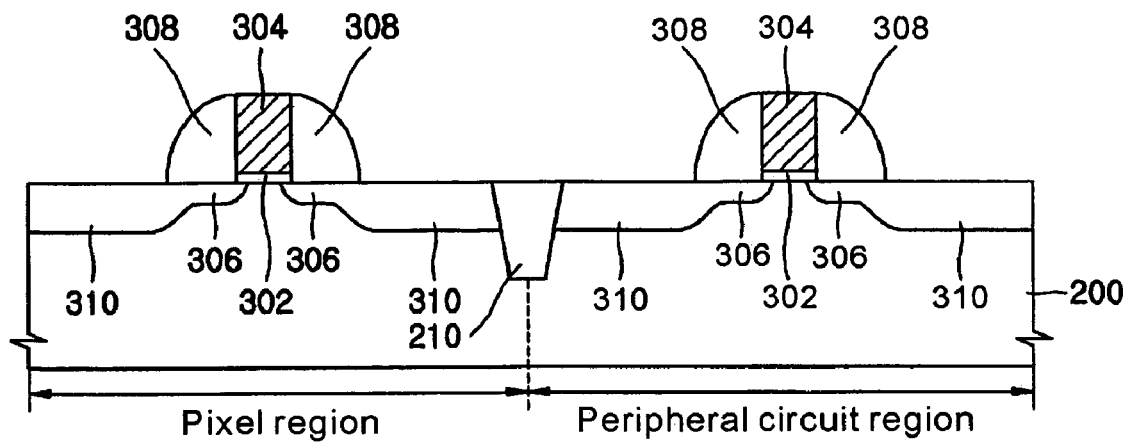

Referring to FIG. 3, a mask layer pattern such as photoresist pattern (not shown) having an opening for partially exposing the polysilicon layer 230 of FIG. 2 is formed on the polysilicon layer. The exposed polysilicon layer 230 and the gate oxide layer 220 underlying the exposed polysilicon layer are removed by using the photoresist pattern as an etching mask. Thus, as shown in FIG. 3, a gate stack having a gate oxide layer 302 and a polysilicon layer 304 is formed in the pixel region and in the peripheral region. Impurity ions for forming a lightly doped drain (LDD) structure are then implanted by an ion implantation process using the gate stack as an implantation mask. A gate spacer layer 308 is subsequently formed on the sidewall of the gate stacks. After an ion implantation process that uses the gate stacks and the gate spacer layer 308 as an implantation mask, an extended source/drain region 306 and a deep source/drain region 310 are formed by a diffusion process such as a rapid thermal process (RTP) at a temperature of about 800° C.

Figure 4:
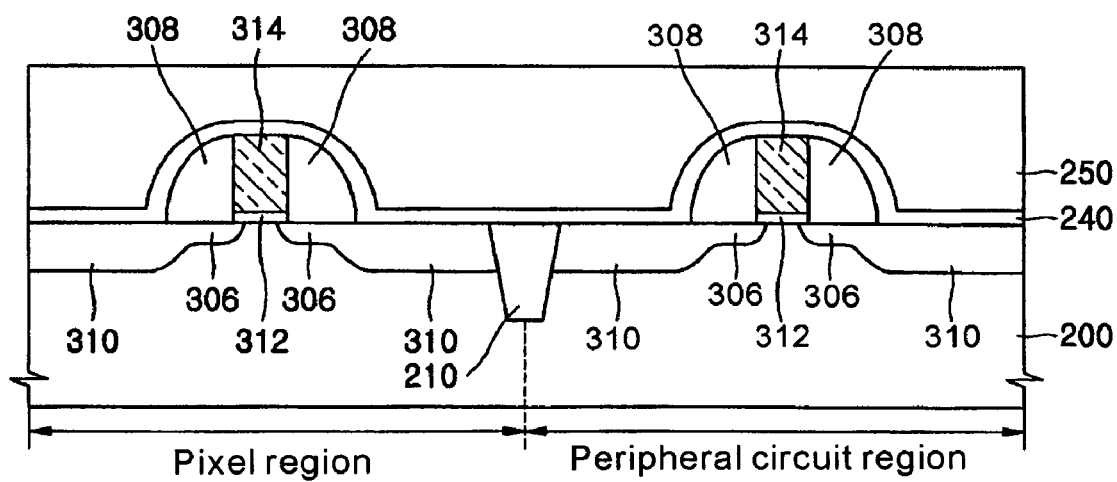

Referring to FIG. 4, the polysilicon layer pattern 304 is removed such that a surface of the gate oxide layer pattern 302 is exposed. Then, the gate oxide layer pattern 302 is removed such that a surface of the semiconductor substrate 200 is exposed. After cleaning the exposed surface of the semiconductor substrate 200, an insulating layer 312 with a high dielectric constant is formed on the exposed surface of the semiconductor substrate 200 in both the pixel region and the peripheral circuit region. The insulating layer 312 with a high dielectric constant may be formed at a relatively low temperature for example under 600° C. Subsequently, a gate electrode layer 314, such as polysilicon layer, is formed on the insulating layer 312 with a high dielectric constant. A liner layer 240, such as a nitride layer, and a dummy pre-metal dielectric layer 250 are then sequentially formed on the entire surface.

Figure 5:
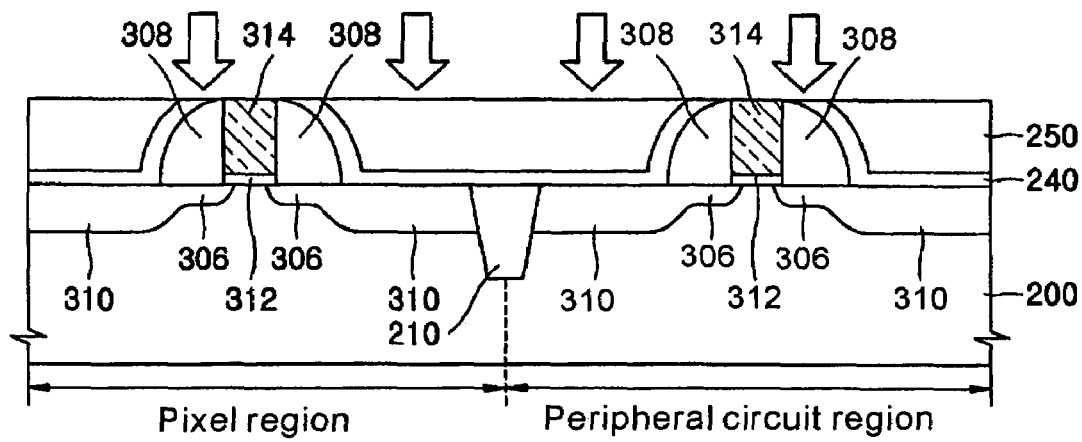

Referring to FIG. 5, the dummy pre-metal dielectric layer 250 and the liner layer 240 are partially removed to a predetermined level by a planarization process. The planarization process may be performed by a chemical mechanical polishing (CMP) method. The gate spacer layer 308 is used as a stop layer for the planarization, therefore, the planarization process is stopped when an upper surface of the gate spacer layer 308 is exposed. Arrows in FIG. 5 indicate a direction of planarization in the planarization process.

Figure 6:
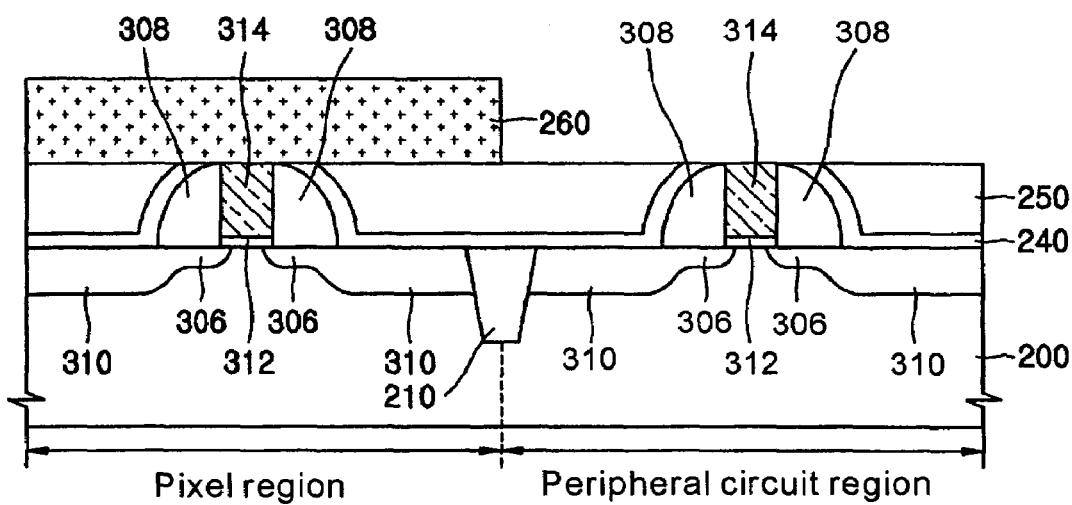

Referring to FIG. 6, after a mask layer (not shown) such as a photoresist layer (not shown) is formed on the entire surface of the semiconductor substrate, a photoresist pattern 260 is formed by a typical photolithography process. Such a photoresist pattern 260 is formed to cover the pixel region but leaves the peripheral circuit region exposed.

Figure 7:
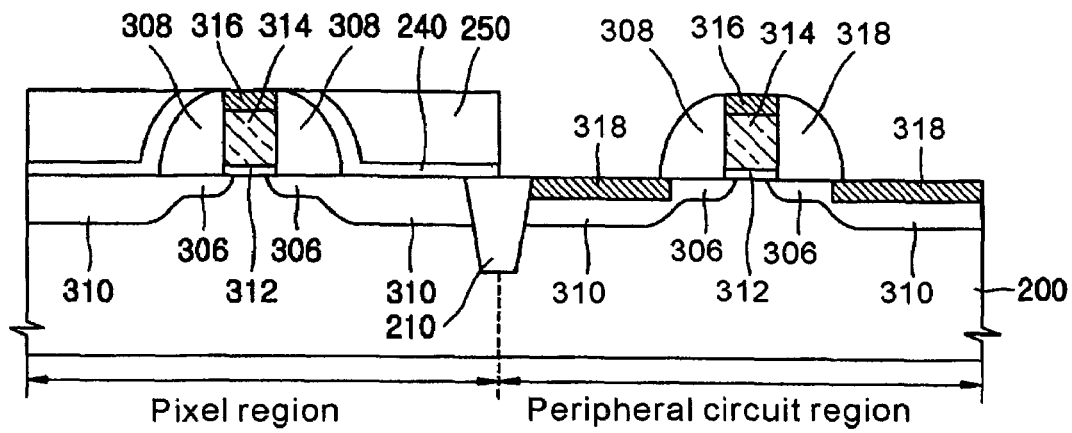

Subsequently, referring to FIG. 7, the dummy pre-metal dielectric layer 250 and the liner layer 240 in the peripheral circuit region are sequentially removed by an etching process using the photoresist pattern 260 of FIG. 6 as an etching mask. The photoresist pattern 260 is then removed. After the etching process, in the pixel region, the liner layer 240 and the dummy pre-metal dielectric layer 250 remain such that only an upper surface of the gate electrode layer 314 is exposed. In the peripheral circuit region, the liner layer 240 and the pre-metal dielectric layer 250 are removed such that upper surfaces of the source/drain region 310 and the gate electrode layer 314 are exposed. A silicidation process is then performed. With the silicidation process, a silicide layer 316 is formed on the gate electrode layer 314 in both the pixel region and the peripheral circuit region, and a silicide layer 318 is formed on the source/drain region 310 only in the peripheral circuit region.

Figure 8:
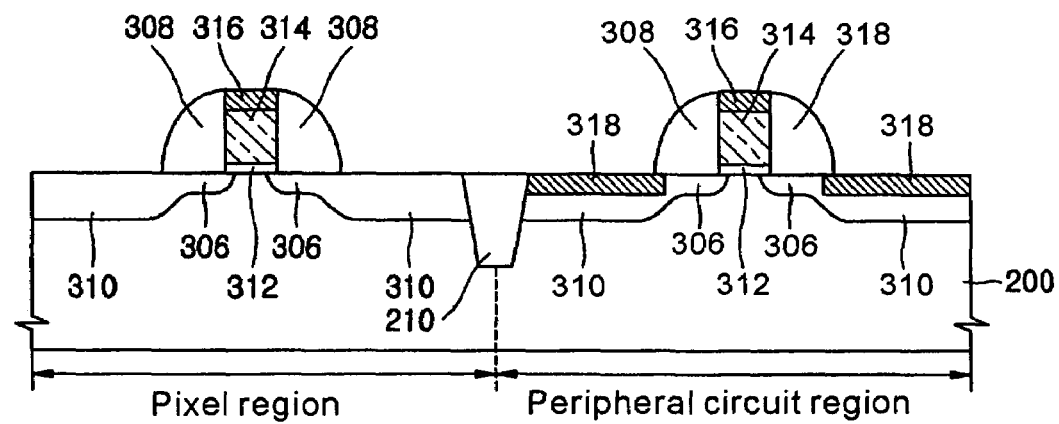

Referring to FIG. 8, the dummy pre-metal dielectric layer 250 and the liner layer 240 remaining in the pixel region are removed such that a surface of the source/drain region 310 in that region is exposed. A CMOS image sensor having the gate insulation layer with a high dielectric constant and the silicide layer 318 on the source/drain region 310 in the peripheral circuit region is thereby manufactured without silicidation of the source/drain region 310 in the pixel region.

As described above, in a method of manufacturing CMOS image sensor according to an exemplary embodiment of the present invention, a gate insulation layer can be formed by the damascene process without deterioration due to high temperature annealing for dopant activation. In addition, a silicide layer is formed on a gate electrode layer in both a pixel region and a peripheral circuit region, but a silicide layer on a source/drain region is formed only in a peripheral circuit region such that operation speed and dark current characteristics of the CMOS image sensor can be improved.

While this invention has been described in connection with what is presently considered to be practical exemplary embodiments, it is to be understood that the invention is not limited to the disclosed embodiments. It will be apparent to those skilled in the art that various modifications and variations can be made in the present invention without departing from the spirit or scope of the invention. Thus, it is intended to cover various modifications and equivalent arrangements included within the spirit and scope of the appended claims.

What is claimed is:

1. A method for manufacturing a CMOS image sensor, comprising:
   forming a dummy gate stack with a gate insulation layer and a dummy gate electrode layer on a semiconductor substrate;
   forming a gate spacer layer on at least a sidewall of the dummy gate stack;
   forming a source/drain region on the semiconductor substrate by an ion implantation process using the dummy gate stack and the gate spacer layer as an implantation mask;
   diffusing the implanted impurity ions by using a rapid thermal process;
   removing the dummy gate stack to expose a partial surface of the semiconductor substrate;
   forming an insulation layer with a high dielectric constant on the exposed surface of the semiconductor substrate;
   forming a gate electrode layer on the insulation layer with a high dielectric constant;
   sequentially forming a liner layer and a dummy pre-metal dielectric layer on the entire surface of the semiconductor substrate having the gate electrode layer thereon;
   partially removing the dummy pre-metal dielectric layer and the liner layer to expose a surface of the gate electrode by a planarization process;
   sequentially removing the dummy pre-metal dielectric layer and the liner layer in a peripheral circuit region by using a mask layer pattern to cover a pixel region;
   forming a suicide layer on the gate electrode layer in the pixel region and on the gate electrode layer and the source/drain region in the peripheral circuit region by a silicidation process; and
   removing the dummy pre-metal dielectric layer and the liner layer remaining in the pixel region.

2. The method of claim 1, further comprising, after forming the dummy gate stack, implanting impurity ions for forming an extended source/drain region of an LDD structure by using the gate stack.

3. The method of claim 1, wherein the forming of the insulation layer with a high dielectric constant is performed at a temperature under 600° C.

4. The method of claim 1, wherein the liner layer is formed as a nitride layer.

* * * * *